United States Patent
Assefa et al.

(10) Patent No.: US 10,026,852 B2
(45) Date of Patent: *Jul. 17, 2018

(54) SILICON PHOTONICS INTEGRATION METHOD AND STRUCTURE

(71) Applicant: INTERNATIONAL BUSINESS MACHINES CORPORATION, Armonk, NY (US)

(72) Inventors: Solomon Assefa, Ossining, NY (US); Tymon Barwicz, Yorktown Heights, NY (US); William M. Green, Irvington, NY (US); Marwan H. Khater, Astoria, NY (US); Jessie C. Rosenberg, Mount Vernon, NY (US); Steven M. Shank, Jericho, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/463,189

(22) Filed: Mar. 20, 2017

(65) Prior Publication Data
US 2017/0194513 A1    Jul. 6, 2017

Related U.S. Application Data

(63) Continuation of application No. 15/142,202, filed on Apr. 29, 2016, now Pat. No. 9,755,087, which is a (Continued)

(51) Int. Cl.
*H01L 21/02*    (2006.01)
*H01L 31/0203*    (2014.01)
(Continued)

(52) U.S. Cl.
CPC ........ *H01L 31/0203* (2013.01); *G02B 6/4253* (2013.01); *H01L 31/02019* (2013.01); (Continued)

(58) Field of Classification Search
USPC ............ 257/369, 437, 13, 79–103, 918, 257/E51.018–E51.022, E33.001–E33.077, (Continued)

(56) References Cited

U.S. PATENT DOCUMENTS 5,228,948 A    7/1993 Deguchi
7,560,784 B2    7/2009 Cheng et al.
(Continued)

FOREIGN PATENT DOCUMENTS

CN    101719504    6/2010

OTHER PUBLICATIONS

Horst et al., "Cascaded Mach-Zehnder wavelength filters in silicon photonics for low loss and flat pass-band WDM (de-)multiplexing", Optics Express, vol. 21, Issue 10, May 6, 2013, pp. 11652-11658.
(Continued)

*Primary Examiner* — Tram H Nguyen
(74) *Attorney, Agent, or Firm* — Steven J. Meyers; Andrew M. Calderon; Roberts Mlotkowski Safran Cole & Calderon, P.C.

(57) ABSTRACT

Approaches for silicon photonics integration are provided. A method includes: forming at least one encapsulating layer over and around a photodetector; thermally crystallizing the photodetector material after the forming the at least one encapsulating layer; and after the thermally crystallizing the photodetector material, forming a conformal sealing layer on the at least one encapsulating layer and over at least one device. The conformal sealing layer is configured to seal a crack in the at least one encapsulating layer. The photodetector and the at least one device are on a same substrate.
(Continued)

The at least one device includes a complementary metal oxide semiconductor device or a passive photonics device.

11 Claims, 8 Drawing Sheets

Related U.S. Application Data continuation of application No. 14/580,564, filed on Dec. 23, 2014, now Pat. No. 9,368,653.

(51) Int. Cl.
*H01L 31/0232* (2014.01)
*H01L 31/18* (2006.01)
*H01L 31/02* (2006.01)
*H01L 31/153* (2006.01)
*G02B 6/42* (2006.01)

(52) U.S. Cl.
CPC ...... *H01L 31/02327* (2013.01); *H01L 31/153* (2013.01); *H01L 31/1808* (2013.01); *H01L 31/1872* (2013.01)

(58) Field of Classification Search
USPC .......... 257/E25.028, E25.032; 438/942–951, 438/22–47, 69, 493, 503, 507, 956
See application file for complete search history.

(56) References Cited

U.S. PATENT DOCUMENTS

| 8,765,536 | B2 | 7/2014 | Assefa et al. |
| 9,171,971 | B2 | 10/2015 | Ellis-Monaghan et al. |
| 9,368,653 | B1 | 6/2016 | Assefa et al. |
| 9,755,087 | B2* | 9/2017 | Assefa ................ H01L 31/0203 |
| 2010/0038689 | A1 | 2/2010 | Ahn et al. |
| 2010/0038736 | A1 | 2/2010 | Assefa et al. |
| 2014/0027826 | A1* | 1/2014 | Assefa .................... H01L 35/34 257/290 |
| 2014/0080269 | A1* | 3/2014 | Assefa ............. H01L 21/76283 438/154 |
| 2014/0091374 | A1* | 4/2014 | Assefa ................ H01L 27/1443 257/290 |
| 2014/0217485 | A1 | 4/2014 | Assefa et al. |
| 2014/0185981 | A1* | 7/2014 | Assefa ................ G06F 17/5068 385/14 |
| 2014/0191326 | A1 | 7/2014 | Assefa et al. |
| 2014/0209985 | A1 | 7/2014 | Assefa et al. |
| 2015/0054041 | A1* | 2/2015 | Assefa ............. H01L 27/14689 257/290 |
| 2015/0340391 | A1* | 11/2015 | Webster ............ H01L 27/14605 348/322 |
| 2016/0247944 | A1 | 8/2016 | Assefa et al. |

OTHER PUBLICATIONS

List of IBM Patents or Patent Applications Treated as Related 1 page.

Specification "Silicon Photonics Integration Method and Structure" and Drawings in U.S. Appl. No. 15/980,014 filed May 15, 2018, 31 pages.

* cited by examiner

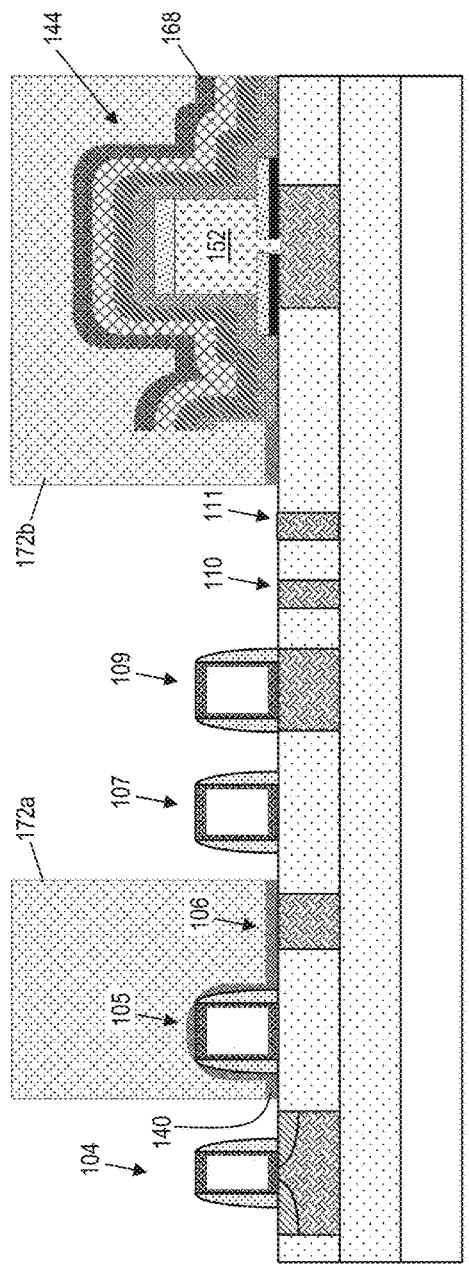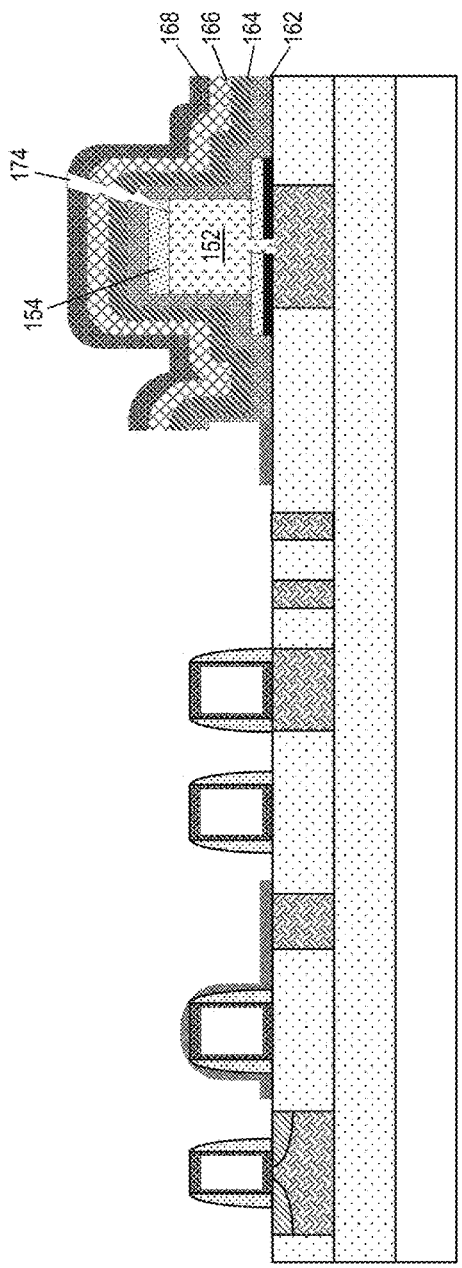

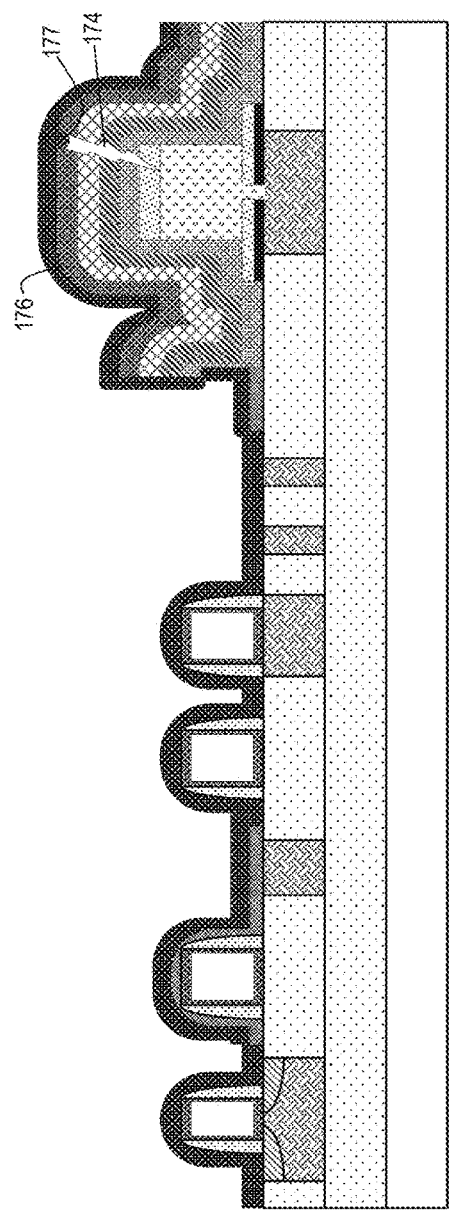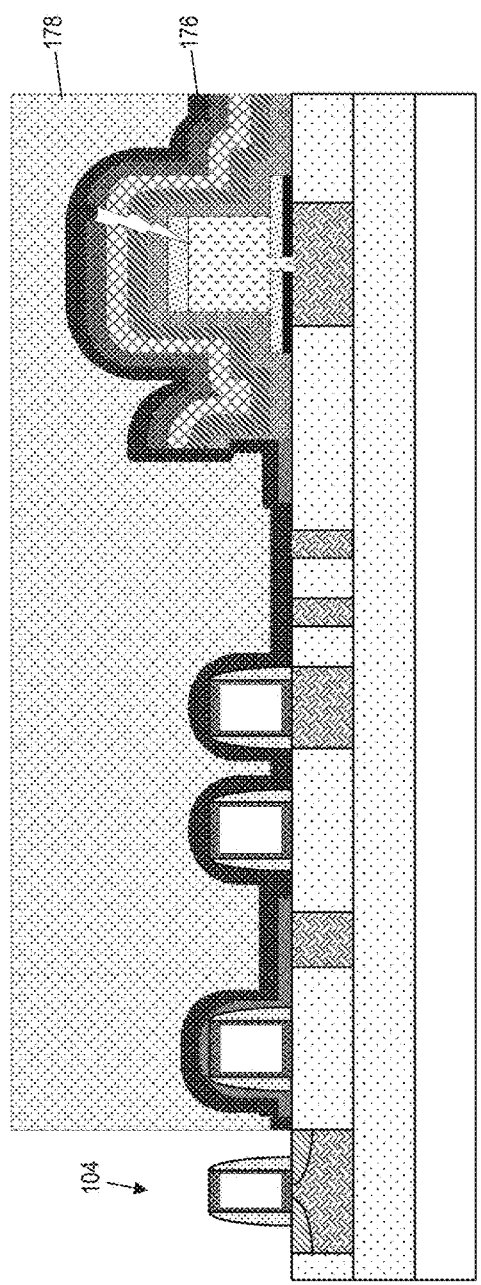

SILICON PHOTONICS INTEGRATION METHOD AND STRUCTURE

FIELD OF THE INVENTION

The invention relates to semiconductor devices and methods of forming the same and, more particularly, to integrated photonic semiconductor devices.

BACKGROUND

Complementary metal oxide semiconductor (CMOS) integrated circuits increasingly make use of optical transmission structures to surpass the bandwidth limitations of copper. The use of both photonic devices in high-speed switching and transceiver devices in data communications are but a few examples that highlight the advantages of processing both optical and electrical signals within a single integrated device. For example, an integrated photonic device may include both photodetector and CMOS type devices that may be fabricated on a single silicon substrate. However, during the fabrication process, certain processes, while benefiting or being necessary for the formation and/or operation of one type of device (e.g., CMOS FET), may be detrimental to the formation and/or operation of the other type of device (e.g., Photodetector).

For example, using a single nitride to block silicide on both optical and CMOS devices results in low performance and yield. Additionally, germanium recrystallization in an encapsulant can crack the encapsulant such that the subsequent wet chemical treatments (e.g., during a silicide process) etch the germanium away. The dielectrics used for silicide protection over passive photonics can be non-uniform (i.e., too thick or too thin at locations) which causes excessive optical loss or cross talk.

It may therefore, among other things, be advantageous to maintain, within an integrated photonic device, the integrity of both photonic and non-photonic type devices during fabrication processes.

SUMMARY

In a first aspect of the invention, there is a method of forming a semiconductor structure. The method includes: forming at least one encapsulating layer over and around a photodetector; thermally crystallizing the photodetector material after the forming the at least one encapsulating layer; and after the thermally crystallizing the photodetector material, forming a conformal sealing layer on the at least one encapsulating layer and over at least one device. The conformal sealing layer is configured to seal a crack in the at least one encapsulating layer. The photodetector and the at least one device are on a same substrate. The at least one device comprises a complementary metal oxide semiconductor device or a passive photonics device.

In another aspect of the invention, there is a method of forming a semiconductor structure. The method includes: forming a complementary metal oxide semiconductor (CMOS) device, a passive photonics device, and a photodetector material on a substrate; forming encapsulating layers over the CMOS device, the passive photonics device, and the photodetector material; removing a portion of the encapsulating layers over the CMOS device and the passive photonics device; crystallizing the photodetector material; and forming a conformal sealing layer over the CMOS device, over the passive photonics device, and on a portion of the encapsulating layers over the photodetector material.

In another aspect of the invention, there is a semiconductor structure that includes: a first device, a second device, and a photodetector on a substrate; encapsulating layers over and around the photodetector; a conformal nitride sealing layer on the first device and on the encapsulating layers over the photodetector; and a nitride barrier layer on the second device and on the encapsulating layers over the photodetector.

In another aspect of the invention, there is a semiconductor structure that includes: a photodetector material on a substrate; a first silicon nitride layer on the photodetector material; a second silicon nitride layer on the first silicon nitride layer and over the photodetector material; an oxide layer on the second silicon nitride layer and over the photodetector material; a third silicon nitride layer on the oxide layer and over the photodetector material; a fourth silicon nitride layer on the third silicon nitride layer and over the photodetector material; a conformal silicon nitride sealing layer on the fourth silicon nitride layer and over the photodetector material; and a silicon nitride barrier layer on the conformal silicon nitride sealing layer and over the photodetector material.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

FIGS. 1-14 show structures and respective processing steps in accordance with aspects of the invention.

DETAILED DESCRIPTION

Figure 1:
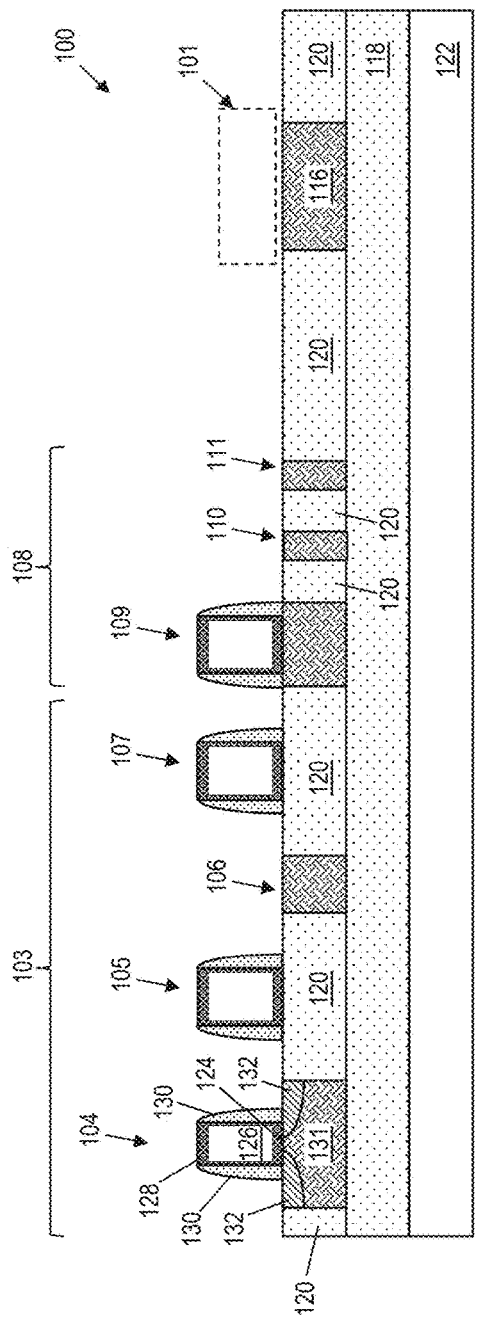

The invention relates to semiconductor devices and methods of forming the same and, more particularly, to integrated photonic semiconductor devices. According to aspects of the invention, a highly conformal silicon nitride sealing layer is formed on encapsulating layers of a photonics device that is integrated with CMOS devices on a single silicon substrate. In embodiments, the nitride sealing layer is formed on the encapsulating layers after thermally crystallizing germanium that is encapsulated by the encapsulating layers, e.g., after utilizing a rapid melt growth (RMG) process to crystallize germanium that will form part of a photodetector. The nitride sealing layer fills cracks that form in the encapsulating layers during the crystallization process and thus advantageously prevents out-diffusion of the germanium and/or chemical attack of the germanium through the cracks. In this manner, implementations of the invention improve performance and yield.

In accordance with aspects of the invention, the conformal nitride sealing layer may be formed over passive photonics devices (such as laser grating couplers, wavelength division multiplexors and de-multiplexors) and CMOS devices (such as precision polysilicon resistors). In embodiments, the conformal nitride sealing layer is formed using rapid thermal chemical vapor deposition (RTCVD), and a silicon nitride barrier layer is formed on the conformal nitride sealing layer using plasma enhanced chemical vapor deposition (PECVD).

In an exemplary implementation, the nitride barrier layer is patterned to remove a portion of the nitride barrier layer from over a laser grating coupler, leaving only the conformal nitride sealing layer over the laser grating coupler. In an exemplary implementation, the conformal nitride sealing layer is patterned to remove a portion of the conformal nitride sealing layer from over a CMOS transistor, the CMOS transistor is subsequently silicided, and the nitride barrier layer is formed over the silicided CMOS transistor. In this manner, the multiple silicon nitride layers improve performance and yield by allowing a designer to select, for a given device, a particular combination from four unique silicon nitride combinations to achieve one or more of the following characteristics: improved nitride thickness uniformity; improved nitride conformality; improved boron out-diffusion; and thermal cycle. Also, dependent on the nitride thickness and process chemistry used to form the nitride film, the stress of the device can be modified to improve device performance.

The structures of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition of thin films of material on a substrate, (ii) applying a patterned mask on top of the films by photolithographic imaging, and (iii) etching the films selectively to the mask.

The structures and processes described herein provide exemplary embodiments of a CMOS integrated nanophotonics device that includes, for example, both a photonic device such as a germanium (Ge) photodetector and a CMOS device such as an FET transistor. Within CMOS integrated nanophotonic circuits, crystalline materials such as germanium or III-V compounds may be utilized as an active element of the photodetector component based on their high quantum efficiency. Using a rapid melt growth technique, films (e.g., germanium) can be deposited at low temperatures in an amorphous state using techniques such as physical vapor deposition (PVD), plasma enhanced chemical vapor deposition (PECVD), and rapid thermal chemical vapor deposition (RTCVD), and subsequently crystallized thermally. During the crystallization process, the germanium material forming the photodetector active region may be encapsulated, using a multi-layer film stack, in order to prevent crystalline defects and contamination as a result of out-diffusion. Thus, an encapsulating multi-layer film stack according to one or more exemplary embodiments is described.

In order to produce a single crystalline germanium active region, a deposited germanium film may be crystallized by heating the semiconductor wafer over which the germanium film is deposited to about 1100° C. At around 940° C., the germanium film transforms from a solid state to a liquid state. During a subsequent cooling stage, the liquid germanium is transformed back to a solid as a single crystalline germanium material for forming, for example, a photodetector active region. If during this germanium crystallization process, an encapsulation stack is not utilized, liquid and/or gaseous formed germanium may contaminate other parts of the semiconductor wafer and/or the process chambers (e.g., chamber used for thermal annealing).

Alternatively, when an encapsulation stack is used, cracks may form in the encapsulation stack during the thermal crystallization process. If one or more cracks occur in the encapsulation stack, the germanium may outdiffuse and cause contamination of the integrated device and/or process chambers. Additionally, the existence of cracks in the encapsulation may subject the underlying germanium to chemical attacks caused by subsequent wet cleans. For example, during the silicide formation process, the chemicals used during the wet clean process may come into contact with the germanium via any cracks in the encapsulation stack. Consequently, all or parts of the germanium may be dissolved by the wet clean chemicals.

FIGS. 1-14 show structures and respective processing steps in accordance with aspects of the invention. The process flow of the present invention may begin with providing the initial structure 100 shown in FIG. 1. In embodiments, the structure 100 comprises an integrated photonic semiconductor structure that includes: a photonic device formation region 101 for fabricating, for example, a germanium (Ge) photodetector; a CMOS region 103 including one or more CMOS devices such as a field effect transistor (FET) 104, a polysilicon resistor 105, a diffusion resistor 106, and a precision polysilicon resistor 107; and a passive photonics region 108 including one or more passive photonics devices such as a polarization splitter rotator 109, a wavelength division multiplexer 110, and a laser grating coupler 111. The integrated photonic semiconductor structure 100 may further include an optical waveguide 116, a buried oxide (BOX) region 118, shallow trench isolation (STI) regions 120, and a silicon substrate 122. The BOX region 118 is located over the silicon substrate 122. The optical waveguide 116 may be formed within a silicon-on-insulator (SOI) layer (not shown) of the structure 100, whereby the STI regions 120 and BOX region 118 surrounding the optical waveguide 116 facilitate optical confinement (i.e., cladding) and low-loss waveguiding. In addition, the STI regions 120 may provide electrical isolation between the various devices.

The structure 100 as thus described can be made using conventional techniques known to those of skill in the art. For example, the FET 104 may include a gate dielectric 124, a polysilicon gate 126, spacer oxide regions 128, spacer nitride regions 130, well region 131 (formed in the SOI layer), source/drain (S/D) regions 132 (formed in the SOI layer), and halo and extension implants (not shown), all of which are formed using conventional CMOS materials and processes such as photolithographic masking, etching, deposition, and ion implantation. Similarly, the polysilicon resistor 105, diffusion resistor 106, precision polysilicon resistor 107 may be formed using conventional CMOS materials and processes. Further, the polarization splitter rotator 109, wavelength division multiplexer 110, and laser grating coupler 111 may be formed using conventional photonics materials and processes. For example, the laser grating coupler 111 may be formed by etching an aperiodic structure into and through the SOI layer and surrounded by STI, BOX, and nitride layer, such that light from a laser or optical fiber delivering light from a laser off-chip, is adiabatically coupled to a silicon waveguide on-chip with low loss, via the laser grating coupler.

Figure 2:
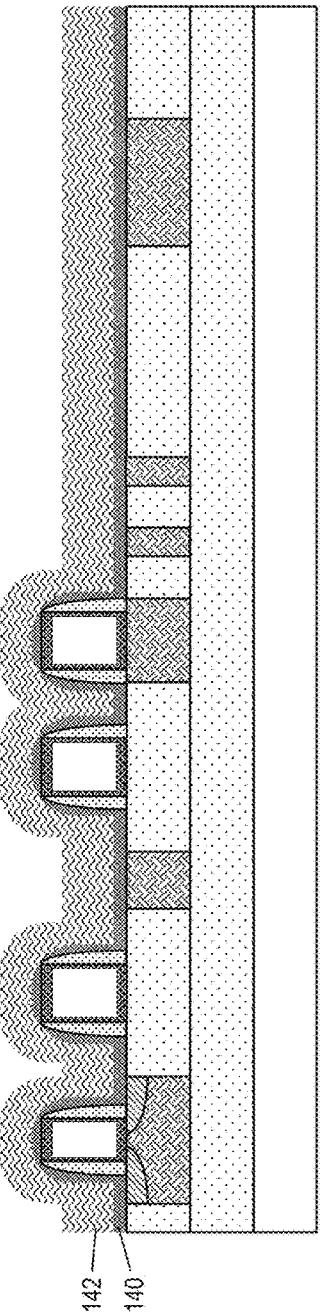

As shown in FIG. 2, a silicon nitride layer 140 is blanket deposited on the devices and surfaces of the structure 100, and an oxide layer 142 is deposited on the silicon nitride layer 140. The silicon nitride layer 140 may be deposited using a low stress plasma enhanced chemical vapor deposition (PECVD) process, and may have a thickness in a range of about 100-1000 Å (although other deposition processes and thicknesses may be used). The oxide layer 142 may be deposited using either a PECVD or a low temperature thermally activated CVD process, and may have a thickness in a range of about 200-2000 Å (although other deposition processes and thicknesses may be used).

Figure 3:
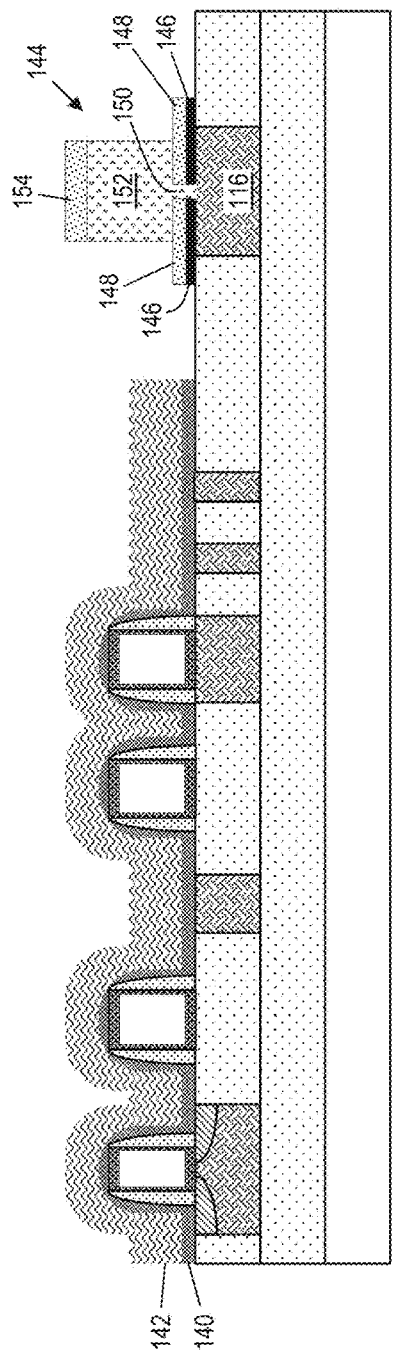

As shown in FIG. 3, portions of the silicon nitride layer 140 and the oxide layer 142 are removed from the area over the optical waveguide 116, and a germanium (Ge) photodetector 144 is formed over the optical waveguide 116. The portions of the silicon nitride layer 140 and the oxide layer 142 may be removed using conventional masking and etching, which may include: applying a photoresist material on the oxide layer 142, exposing the photoresist to a desired pattern of radiation, developing the exposed photoresist utilizing a resist developer, etching (dry etching and/or wet etching) the silicon nitride layer 140 and the oxide layer 142 through the patterned photoresist, and removing the remaining photoresist by ashing or stripping.

After removing the portions of the silicon nitride layer 140 and the oxide layer 142, a Ge photodetector 144 may be formed using conventional processes. For example, a thin oxide layer 146 of about 50 Å may be formed on the optical waveguide structure 116 and portions of the STI regions 120. The thin oxide layer 146 may be formed using a CVD or PECVD process. Additionally, a thin silicon nitride layer 148 of about 400 Å may be formed on the thin oxide layer 146. The thin silicon nitride layer 148 is preferably formed using a PECVD process. An opening (window) 150 is formed through the thin oxide layer 146 and the thin silicon nitride layer 148 to expose an upper surface of the optical waveguide 116. The opening 150 may be formed by etching the thin oxide layer 146 and the thin silicon nitride layer 148 through a patterned resist layer, as already described herein. Forming the Ge photodetector 144 further comprises forming a Ge active region 152 by: depositing (e.g., using PECVD) a layer of Ge both within opening 150 and over the thin silicon nitride layer 148; forming a silicon nitride ($Si_3N_4$) hard mask layer 154 on the top surface of the Ge layer; patterning the silicon nitride hard mask layer 154 using a photoresist mask and etching; and patterning the Ge layer by etching portions of the Ge layer that are not covered by the remaining portion of the patterned silicon nitride hard mask 154.

During the formation of the Ge active region 152, a portion of the Ge active region 152 fills the opening 150 in order for the Ge active region 152 to establish contact with the silicon material of optical waveguide 116. Such contact may enable the Ge active region 152 to utilize the silicon material of optical waveguide 116 as a seed layer during the crystallization process of the Ge active region 152 at a later process stage. The remaining regions of the bottom portion of Ge active region 152 (i.e., other than the portion in the opening 150) are separated from the optical waveguide 116 by the thin oxide layer 146 and the thin silicon nitride layer 148. This separation of portions of the Ge active region 152 and the optical waveguide 116 may facilitate the avoidance of the intermixing of germanium from the Ge active region 152 with the silicon of the optical waveguide 116. For example, one effect of such intermixing would be to reduce the responsivity of the Ge active region 152 and consequently the formed photodetector 144.

The optical signal traversing within the optical waveguide 116 may be received by the Ge active region 152 through the thin oxide layer 146 and the thin silicon nitride layer 148. Although any received optical signal received by the Ge active region 152 is attenuated by layers 146 and 148, based on the thickness of the layers 146 and 148 the attenuation is low enough in order to not impede the operation and sensitivity of the photodetector 144.

Figure 4:
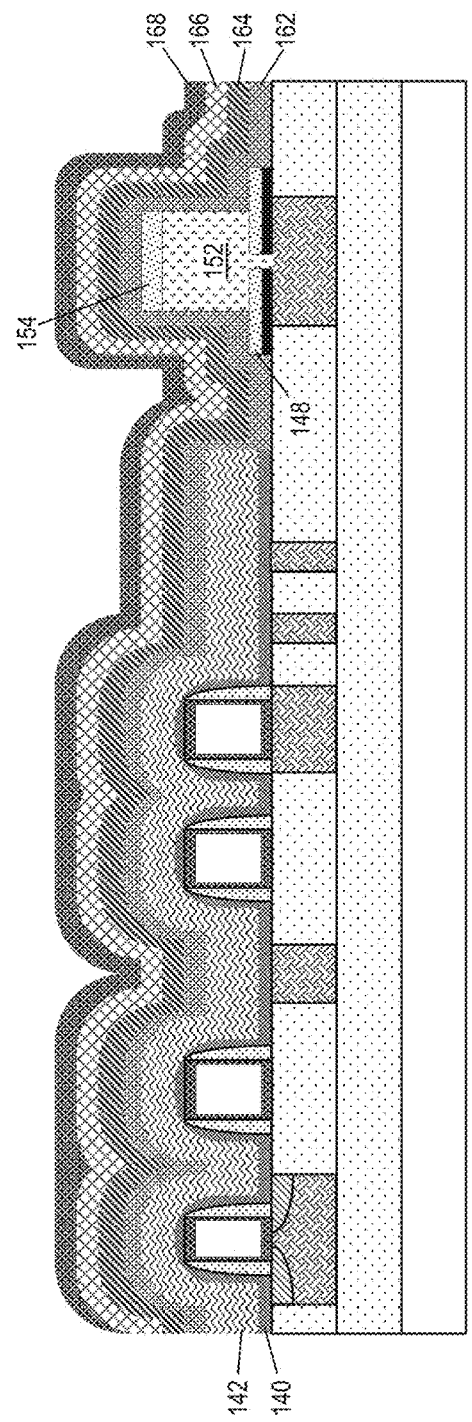

As shown in FIG. 4, a plurality of encapsulating layers 162, 164, 166, 168 are formed on the upper surfaces of the structure. As illustrated, a silicon nitride layer 162 is deposited on exposed surfaces of the thin silicon nitride layer 148, the Ge active region 152, the silicon nitride hard mask layer 154, and the oxide layer 142. The silicon nitride layer 162 is preferably deposited using a PECVD process. The silicon nitride layer 162 may include a thickness in the range of about 100-1000 Å. Preferably, the silicon nitride layer 162 has a thickness of approximately 500 Å and acts as a buffer layer for subsequently deposited layers such as, for example, oxide layer 164 and silicon nitride layer 166.

Still referring to FIG. 4, an oxide layer 164 is deposited over the silicon nitride layer 162 using either a PECVD or a low temperature thermally activated CVD deposition process. The oxide layer 164 may have a thickness in the range of about 100-2000 Å. Preferably, the oxide layer 164 has a thickness of approximately 500 Å and mitigates germanium expansion during the crystallization melt process of the Ge active region 152. A silicon nitride layer 166 is deposited over the oxide layer 164 using a PECVD process. The silicon nitride layer 166 may have a thickness in the range of about 500-3000 Å. Preferably, the silicon nitride layer 166 has a thickness of approximately 1000 Å and mitigates germanium expansion during the crystallization melt process. Another silicon nitride layer 168 is deposited over the silicon nitride layer 166 using a rapid thermal chemical vapor deposition (RTCVD) process. The silicon nitride layer 168 may have a thickness in the range of about 500-2000 Å. Preferably, the silicon nitride layer 168 has a thickness of approximately 1000 Å and acts as a sealant of seams and controller of PECVD morphology.

Figure 5:
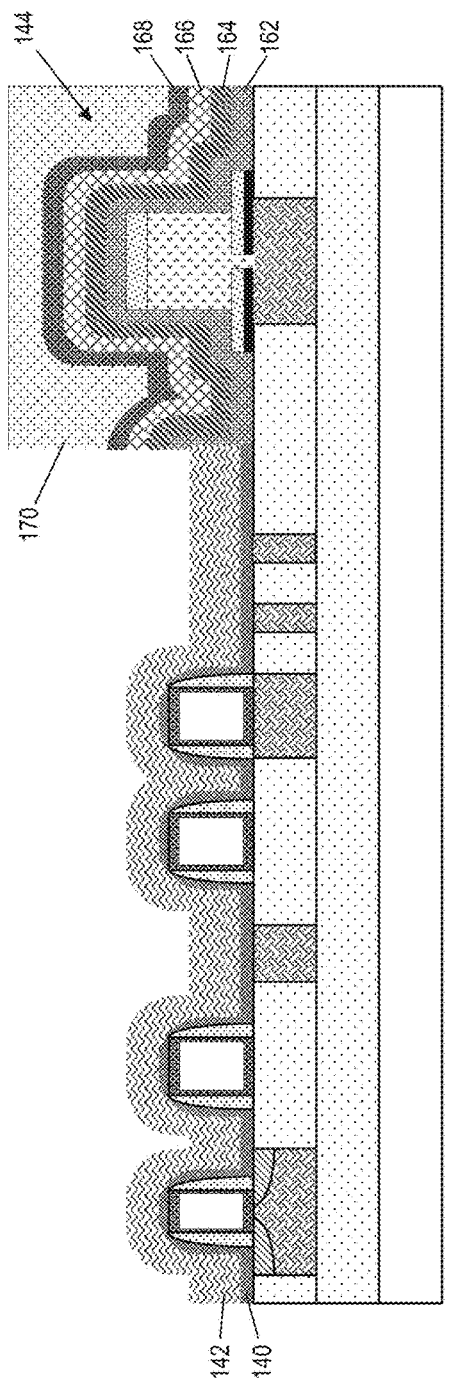

As shown in FIG. 5, a mask 170 is formed over the photodetector 144. The mask 170 may comprise photoresist that is patterned using photolithography. The portions of layers 162, 164, 166, and 168 that are not covered by the mask 170 are removed from over the passive photonics and the CMOS devices. The removal of layers 162, 164, 166, and 168 may be performed using one or more etch processes including a dry etch such as a reactive ion etch (RIE) process that ends on the oxide layer 142.

Figure 6:
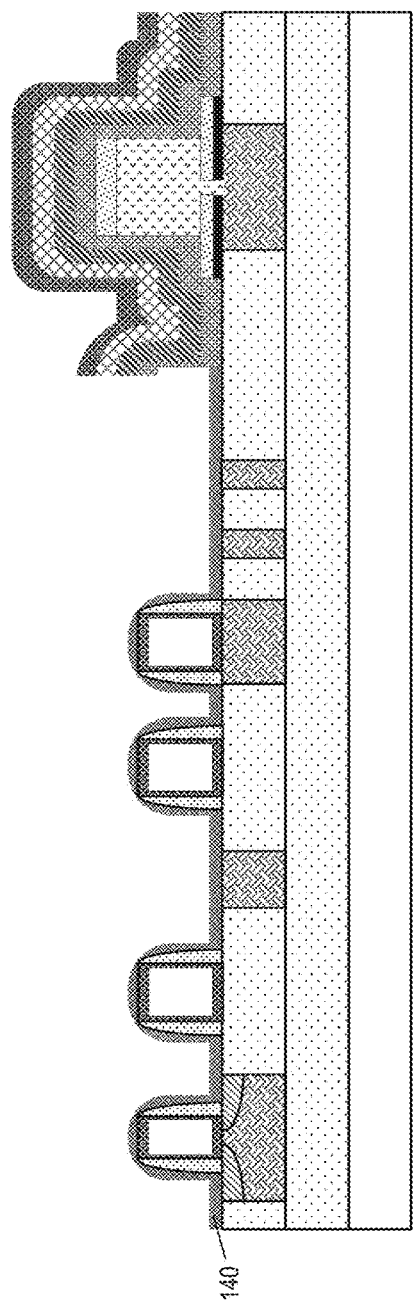

As shown in FIG. 6, the mask 170 and the oxide layer 142 are removed. The mask 170 may be removed using a conventional ashing or stripping process. The oxide layer 142 may be removed using an etch process that is highly selective to nitride, such as a wet etch using HF (hydrofluoric acid). The removal of the oxide layer 142 exposes portions of the nitride layer 140.

As shown in FIG. 7, a mask 172a is formed on the silicon nitride layer 140 over the polysilicon resistor 105 and the diffusion resistor 106. Also, a mask 172b is formed on the silicon nitride layer 168 over the photodetector 144. The masks 172a and 172b may comprise patterned photoresist. After forming the masks 172a and 172b, unmasked portions of the silicon nitride layer 140 are removed, e.g., using an RIE process. In embodiments, removal of portions of the silicon nitride layer 140 exposes one or more of the FET 104, the precision poly resistor 107, the polarization splitter rotator 109, the multiplexer 110, and the laser grating coupler 111.

As shown in FIG. 8, after patterning the silicon nitride layer 140 as depicted in FIG. 7, the germanium of the Ge active region 152 is crystallized. For example, Ge active region 152 may be crystallized (i.e., to produce single crystalline germanium in the Ge active region 152) by heating the semiconductor wafer over which the germanium film is deposited to about 1100° C. At around 940° C., the germanium film transforms from a solid state to a liquid state. During a subsequent cooling stage, the liquid germanium is transformed back to a solid as a single crystalline germanium material.

Still referring to FIG. 8, the crystallization process often produces a crack 174 that extends through the encapsulating layers 162, 164, 166, 168 to the germanium of the Ge active region 152. The crack 174 may extend through the hard mask layer 154, or may intersect a sidewall of the Ge active region 152. The crack 174 may disadvantageously permit out-diffusion of the germanium of Ge active region 152 and/or chemical attack of the germanium of Ge active region 152 during subsequent processing steps.

As shown in FIG. 9, implementations of the invention include a highly conformal sealing layer 176 formed on all the exposed surfaces of the structure and that forms a plug 177 in the crack 174. In embodiments, the sealing layer 176 is preferably a dielectric material such that it may withstand subsequent HF etch processes. In embodiments, the sealing layer 176 is preferably nitride such that it may withstand both a aggressive metal pre-cleaning prior to metal sputtering and a process for stripping of unreacted metal, e.g., involved in a subsequent silicide process of the FET 104. In embodiments, the sealing layer 176 is preferably formed using a highly conformal process and to a sufficient thickness such that the material of the sealing layer 176 plugs the crack 174, which may have an opening (width) of less than 0.1 micron. According to aspects of the invention, the sealing layer 176 comprises silicon nitride formed using an RTCVD process and having a thickness of about 300 Å or more. Although PECVD is a conformal deposit process, PECVD in practice does not exhibit the conformality required to fill cracks, such as crack 174, that form in the encapsulating layers. Accordingly, implementations of the invention preferably utilize an RTCVD process for forming the silicon nitride sealing layer 176 since RTCVD exhibits better conformality than PECVD. The silicon nitride sealing layer 176 may have a thickness other than 300 Å when the thickness is necessary to provide sufficient material to plug the crack 174. As shown in FIG. 9, the silicon nitride sealing layer 176 is formed over the Ge photodetector, the passive photonics devices, and the CMOS devices.

As shown in FIG. 10, a mask 178 is formed over all the devices except for the FET 104. The mask 178 may be patterned photoresist. Still referring to FIG. 10, the unmasked portion of the silicon nitride sealing layer 176 is removed, e.g., using a dry etch such as an RIE process. The mask 178 is removed after etching the silicon nitride sealing layer 176.

Figure 11:
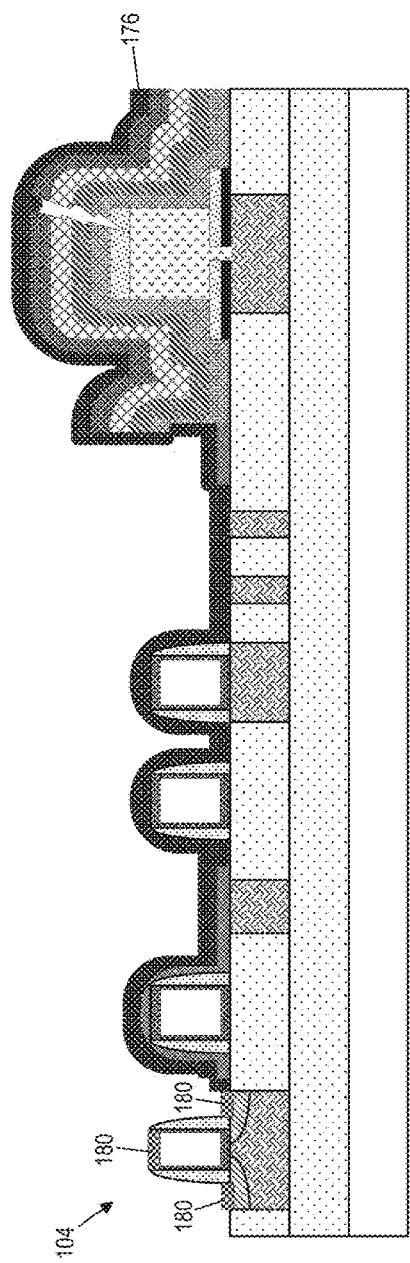

As shown in FIG. 11, silicide regions 180 are formed on portions of the FET 104. The silicide regions 180 may be formed using conventional silicide processing including: sputtering metal onto exposed surfaces of the structure, annealing the structure to cause the sputtered metal to react with underlying silicon, and stripping away any unreacted metal. The silicon nitride sealing layer 176 protects the other devices during the silicide process that forms the silicide regions 180.

Figure 12:
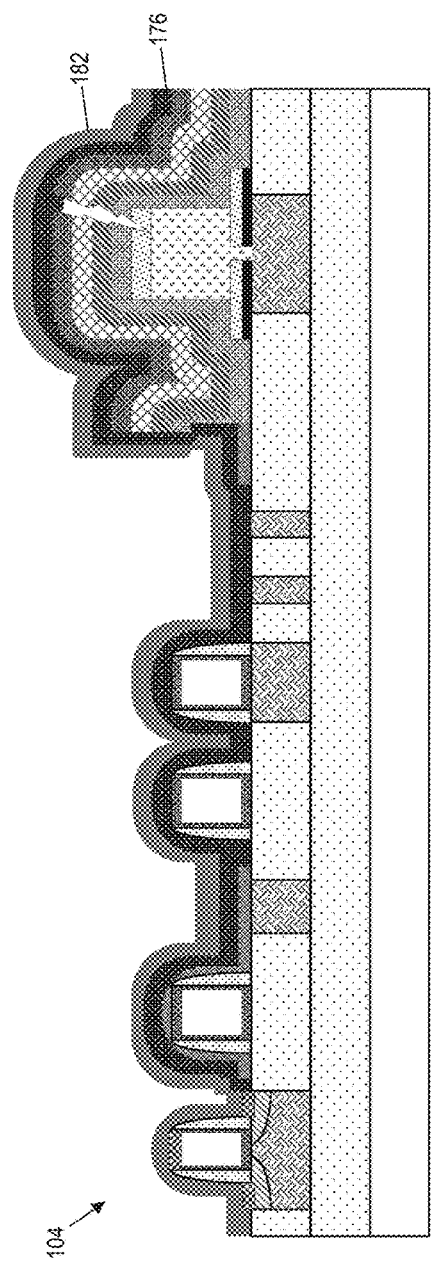

As shown in FIG. 12, a barrier nitride layer 182 is formed on the exposed surfaces of the structure, including on the layer 176 and the FET 104. In embodiments, the barrier nitride layer 182 comprises silicon nitride formed using PECVD and has a thickness in the range of 500-3000 Å, preferably approximately 1000 Å (although other thicknesses may be used).

Figure 13:
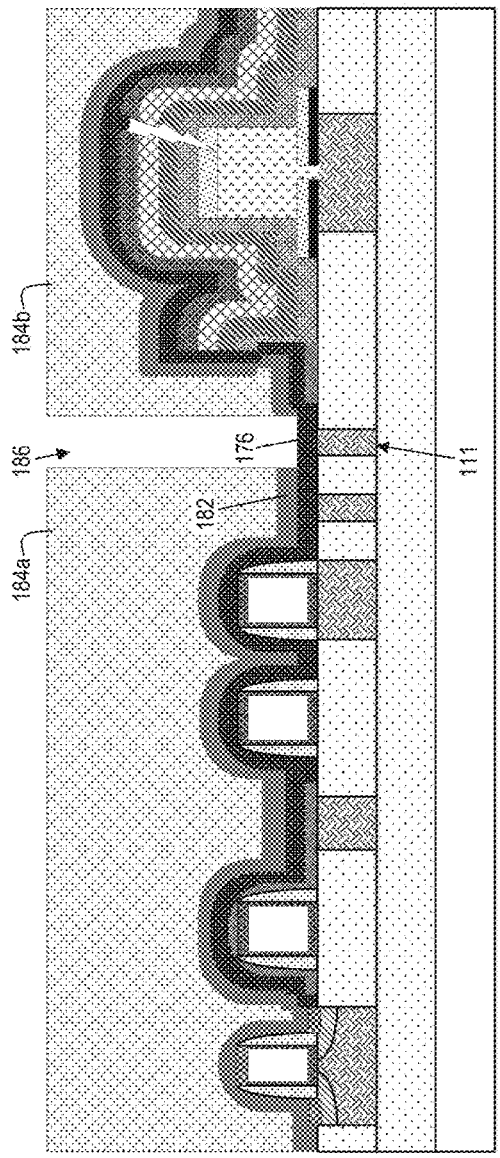

As shown in FIG. 13, a mask 184*a* and a mask 184*b* are formed over all the devices except for the laser grating coupler 111. For example, a photoresist material may be applied and patterned to have an opening 186 over the laser grating coupler 111. Still referring to FIG. 13, the unmasked portion of the barrier nitride layer 182 is removed by etching through the opening 186.

Still referring to FIG. 13, because the barrier nitride layer 182 and the underlying sealing layer 176 both comprise silicon nitride, an etch is used that is selective to the underlying sealing layer 176. Specifically, implementations utilize an etch process that removes PECVD nitride faster than it removes RTCVD nitride. For example, a 10:1 DHF (dilute HF) etch chemistry may be used that etches PECVD nitride at a rate of about 5 times as fast as it etches RTCVD nitride. As another example, a 100:1 DHF (dilute HF) etch chemistry may be used that etches PECVD nitride about 4 times faster than RTCVD nitride. As another example, a 50:1 BOE (buffered oxide etch, also called buffered HF or BHF) may be used that etches PECVD nitride about 4 times faster than RTCVD nitride.

With continued reference to FIG. 13, the barrier nitride layer 182 is removed from over the laser grating coupler 111 to improve the transmission loss characteristics of the laser grating coupler 111 with respect to coupling sensitivity to vertical misalignment. Specifically, the combined thickness of the barrier nitride layer 182 and the underlying sealing layer 176 negatively impacts the transmission loss characteristics of the laser grating coupler 111. Removal of the barrier nitride layer 182 decreases the overall nitride thickness over the laser grating coupler 111 and thus improves the transmission loss characteristics of the laser grating coupler 111.

Figure 14:
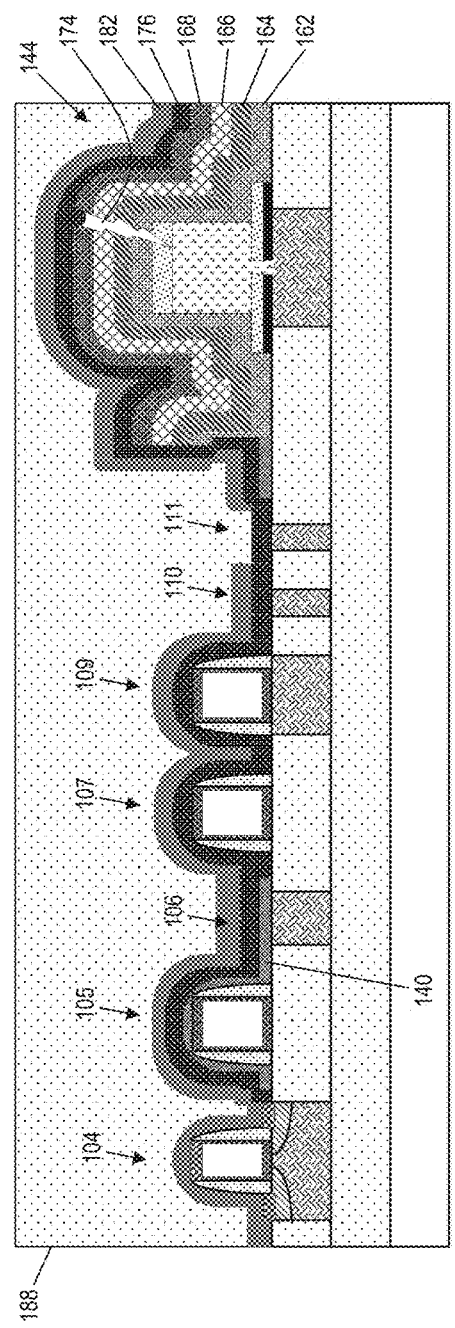

As shown in FIG. 14, the masks 184*a* and 184*b* are removed and an interlevel dielectric (ILD) layer 188 may be formed over the entire structure. For example, the ILD layer 188 may comprise a thick oxide layer (e.g., 1 µm thickness) of borophosphosilicate glass (BPSG) deposited on the exposed surfaces of the structure and planarized using, for example, chemical mechanical polishing (CMP). The ILD layer 188 may be used in subsequent contact formation steps (not shown) corresponding to one or more of the devices 104-107, 109-111 and 144.

With reference to FIG. 14, aspects described herein permit a designer to selectively remove one or both of the sealing layer 176 and the barrier nitride layer 182 from over any one or more of the devices 104-107, 109-111 and 144. For example, as shown in FIG. 14, the FET 104 is covered by the barrier nitride layer 182 but not the sealing layer 176, the laser grating coupler 111 is covered by the sealing layer 176 but not the barrier nitride layer 182, and all other devices are covered by both the sealing layer 176 and the barrier nitride layer 182. The two layers 176 and 182 provide four unique combinations of silicon nitride overlay that may be selected from for each device to optimize characteristics of each device. The four unique combinations of silicon nitride overlay for a particular device include: both layers 176 and 182 present over the device; only layer 176 present over the device (i.e., layer 182 removed from over the device); only layer 182 present over the device (i.e., layer 176 removed from over the device); and both layers 176 and 182 removed from over a device.

As further shown in FIG. 14, aspects described herein also provide a highly conformal sealing layer 176 that plugs a crack 174 that forms the encapsulating layers 162, 164, 166, 168 (and possibly also the hard mask layer 154). In this manner, the germanium of the Ge photodetector 144 is protected even when such cracks occur.

Still referring to FIG. 14, a portion of the nitride layer 140 may be left intact over one or more devices. For example, a portion of the nitride layer 140 may remain over the polysilicon resistor 105 and the diffusion resistor 106 to tune the operating characteristics of these devices.

Figure 15:
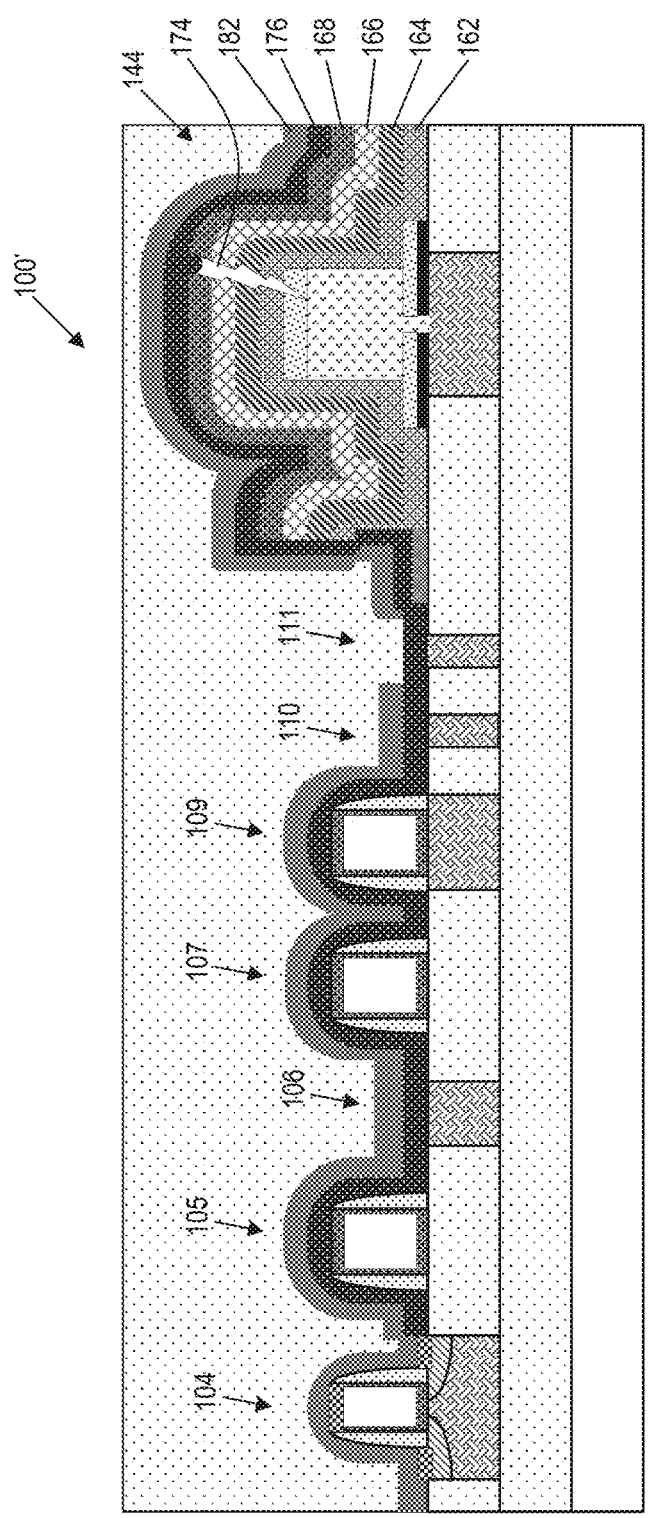
FIG. 15 shows an implementation in accordance with aspects of the invention.

FIG. 15 shows an implementation of the structure 100' in which the nitride layer 140 is completely removed from over all the devices 104-107 and 109-111. The structure of FIG. 15 may be obtained by using the same steps described with respect to FIGS. 1-14, but omitting the mask 172a shown in FIG. 7 such that the entire nitride layer 140 is removed from over the devices. The structure 100' includes the encapsulating layers 162, 164, 166, 168 formed over the Ge photodetector 144. The structure 100' also includes the sealing layer 176 and the barrier nitride layer 182.

Implementations described herein include novel methods and structures to integrate passive and active optical and CMOS devices on a common substrate. In embodiments, four unique silicon nitride combinations are used to improve performance and yield. In embodiments, a conformal silicon nitride layer is used to seal cracks in the photodetector to improve yield on aggressive layouts.

In accordance with aspects described herein, a method comprises forming a conformal silicon nitride layer (e.g., sealing layer 176) on a second silicon nitride layer (e.g., layer 168) that is on a third silicon nitride layer (e.g., layer 166). The third silicon nitride layer is on a silicon oxide layer (e.g., layer 164), which is on a fourth silicon nitride layer (e.g., layer 162). The fourth silicon nitride layer is on a fifth silicon nitride layer (e.g., layer 154) that is on a germanium layer (e.g., region 152). The forming the conformal silicon nitride layer (e.g., sealing layer 176) in this manner improves photodetector yield. The method may also include simultaneously forming the conformal silicon nitride layer (e.g., sealing layer 176) on SOI or polysilicon to improve performance on at least one of laser grating couplers, wavelength division multiplexors and de-multiplexors, and precision poly resistors. The method may also include forming the conformal silicon nitride layer (e.g., sealing layer 176) on sixth silicon nitride layer (e.g., layer 140) on SOI or polysilicon to improve resistor performance.

The conformal silicon nitride layer (e.g., sealing layer 176) is used to seal cracks (e.g., crack 174) in the said second, third, fourth and fifth nitride layers and the oxide layer on the germanium to improve photodetector yield for aggressive layouts. In embodiments, the conformal silicon nitride layer (e.g., sealing layer 176) is formed using RTCVD, and the third through sixth silicon nitride layers are formed using PECVD. The method may also include forming a seventh silicon nitride layer (e.g., barrier layer 182) on the conformal silicon nitride layer (e.g., sealing layer 176), wherein the seventh silicon nitride layer is formed using PECVD. The method may further include removing the seventh silicon nitride layer (e.g., barrier layer 182) from over a laser grating coupler (e.g., device 111) to improve performance of the laser grating coupler.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming a photodetector on and over an optical waveguide;
    forming at least one encapsulating layer over and around the photodetector; and
    forming a conformal sealing layer on the at least one encapsulating layer,
    wherein the conformal sealing layer is configured to seal a crack in the at least one encapsulating layer.

2. The method of claim 1, wherein:
    thermally crystallizing the photodetector material forms the crack in the at least one encapsulating layer; and
    the conformal sealing layer plugs the crack.

3. The method of claim 1, wherein the forming the conformal sealing layer comprises forming a silicon nitride layer using rapid thermal chemical vapor deposition.

4. The method of claim 1, wherein the conformal sealing layer is formed over a transistor, and further comprising:
    masking a first portion of the conformal sealing layer over the photodetector; and
    removing a second portion of the conformal sealing layer from over the transistor.

5. The method of claim 4, further comprising:
    forming silicide on the transistor after the removing a second portion of the conformal sealing layer from over the transistor; and
    forming a barrier layer on both the transistor and the first portion of the conformal sealing layer over the photodetector.

6. The method of claim 5, wherein:
    the forming the conformal sealing layer comprises forming a silicon nitride layer using rapid thermal chemical vapor deposition; and
    the forming the barrier layer comprises forming another silicon nitride layer using plasma enhanced chemical vapor deposition.

7. The method of claim 1, wherein the conformal sealing layer is formed over a laser grating coupler, and further comprising:

forming a barrier layer on both a first portion of the conformal sealing layer over the photodetector and a second portion of the conformal sealing layer over the laser grating coupler; and removing a portion of the barrier layer from over the laser grating coupler.

8. The method of claim 1, wherein the conformal sealing layer is formed over a first device, a second device, and the at least one encapsulating layer, and further comprising:

removing a portion of the conformal sealing layer from over the first device;

forming a barrier layer on the first device and on the conformal sealing layer over both the second device and the at least one encapsulating layer; and removing a portion of the barrier layer from over the second device.

9. The method of claim 1, wherein the conformal sealing layer is formed over at least one device.

10. The method of claim 9, further comprising forming a nitride layer on the at least one device prior to the forming the conformal sealing layer, wherein the conformal sealing layer is formed on the nitride layer.

11. The method of claim 10, wherein the at least one device comprises a resistor.

* * * * *